United States Patent [19]

Castro

[11] 4,376,659
[45] Mar. 15, 1983

[54] PROCESS FOR FORMING SEMICONDUCTOR ALLOYS HAVING A DESIRED BANDGAP

[75] Inventor: Carlos A. Castro, Garland, Tex.

[73] Assignee: Texas Instruments Incorporated, Dallas, Tex.

[21] Appl. No.: 292,755

[22] Filed: Aug. 13, 1981

Related U.S. Application Data

[63] Continuation-in-part of Ser. No. 269,292, Jun. 1, 1981.

[51] Int. Cl.³ .................. H01L 21/42; H01L 21/423; H01L 21/36
[52] U.S. Cl. ..................................... 148/1.5; 148/174; 148/175; 156/604; 156/DIG. 72; 219/121 LF; 357/16
[58] Field of Search .................. 75/134 H, 151, 169, 75/135, 134 T, 134 P; 148/1.5, 13, 13.1, 127, 179, 175, 174; 29/572; 427/53.1; 156/604, DIG. 72; 357/11, 30, 16; 219/121 L, 121 LC, 121 LD, 121 LE, 121 LF, 121 LM

[56] References Cited

U.S. PATENT DOCUMENTS

| 2,953,690 | 9/1960 | Lawson et al. | 75/169 X |
| 3,424,890 | 1/1960 | Kuyven | 219/121 LD |
| 3,514,347 | 5/1977 | Fumeron et al. | 75/134 H X |
| 3,723,190 | 3/1970 | Kruse et al. | 75/169 X |

Primary Examiner—L. Dewayne Rutledge
Assistant Examiner—Alan E. Schiavelli
Attorney, Agent, or Firm—Robert Groover, III; Melvin Sharp; James T. Comfort

[57] ABSTRACT

An epitaxial layer of a narrow-gap semiconductor is deposited on a substrate comprising a wider-gap semiconductor. The opposite surface of the substrate is then illuminated with light pulses at a wavelength corresponding to the desired bandgap of the resulting material. Each pulse causes localized heating where it first encounters a material having a sufficiently narrow bandgap to be an absorber at the wavelength of illumination. This localized heating will then cause interdiffusion, producing a layer of semiconductor alloy having a bandgap intermediate between the bandgaps of the two starting materials. Repetition of this step will have the effect of moving the region of localized absorption away from the original location, and toward the film/air interface. Since the desired end product composition will be transparent to the illumination applied, the process is inherently self-limiting. By appropriately selecting the wavelength of illumination applied, variously proportioned semiconductor compositions may be obtained, so that the bandgap of the resulting material may be arbitrarily selected to have any desired value between the bandgaps of the two starting materials. No surface damage is caused by this technique.

20 Claims, 8 Drawing Figures

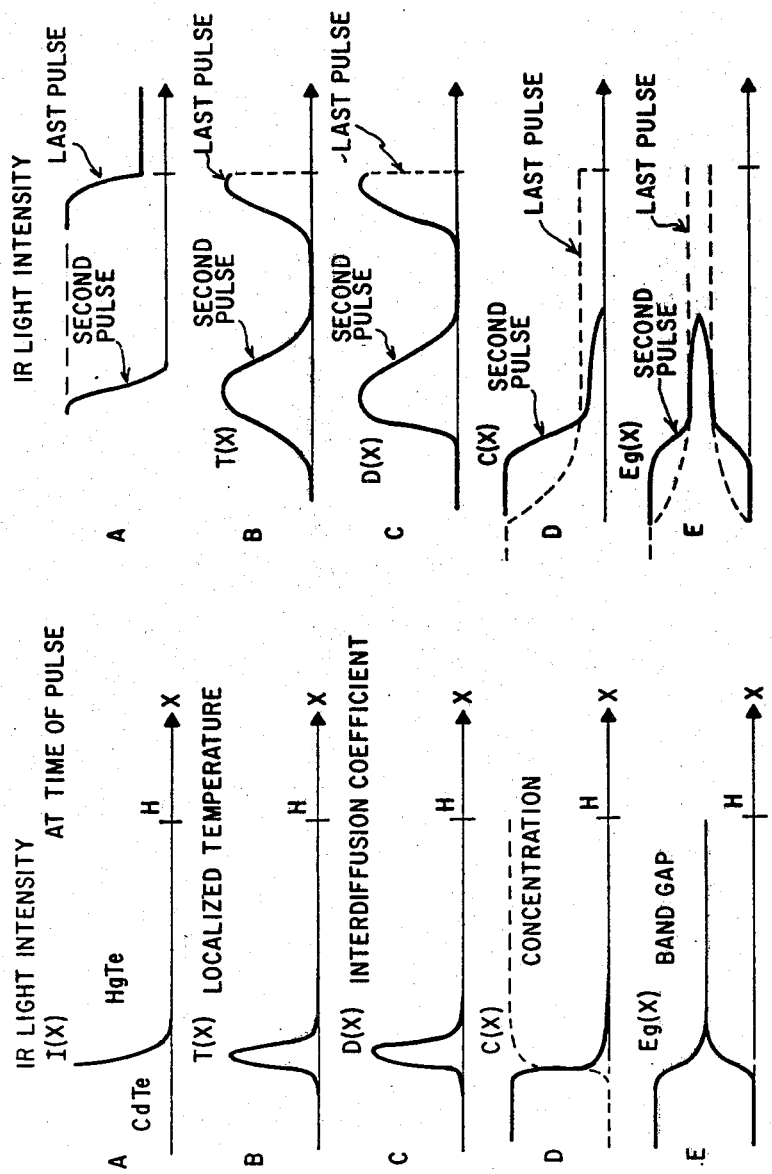

PROCESS FOR FORMING SEMICONDUCTOR ALLOYS HAVING A DESIRED BANDGAP

CROSS-REFERENCE TO RELATED APPLICATION

The present application is a continuation-in-part of Ser. No. 269,292 filed June 1, 1981.

BACKGROUND OF THE INVENTION

The present invention relates to a method for fabricating a layer of semiconductor material having an arbitrarily preselected bandgap.

The present invention is applicable in general to any system where a semiconductor alloy is formed between two semiconductor materials having different bandgaps. (A semimetal material may be used in place of the narrow-bandgap semiconductor material.) The numerous known semiconductor species theoretically permit formation of many such alloy systems, such as $Hg_{1-x}Cd_xTe$ or $Al_xGa_{1-x}As$. However, it is frequently difficult to control the exact composition of an alloy which is formed between two such materials, and for some applications it is highly desirable to be able to control the composition of the final alloy achieved with some precision.

It would also be highly desirable to be able to produce a multi-color imager on a single monolithic substrate. At present, multi-color imaging is normally achieved by separately projecting images onto different image planes, with appropriate color filtering. However, a monolithic multi-color imager, if that were possible, would permit a much simpler arrangement.

In addition, further advantages may be provided by a multi-color detector which is separately sensitive to more than three wavelengths. While information at three separated wavelengths suffices to duplicate ordinary human color vision, independent sensing at a larger number of wavelengths may be desirable for certain diagnostic and analytic applications.

In addition, it may also be desirable to precisely select the bandgap of a semiconductor alloy for other purposes. See, e.g., Baliga, "Optimum Semiconductors for Power Field Effect Transistors", *Electron Device Letter* 162 (July 1981), which is hereby incorporated by reference.

Similarly, it would be highly desirable to be able to incorporate multiple light-emitting devices, operating at different frequencies in a single monolithic device. Such a structure would have useful applications both in multi-band optical communications systems, and also in displays.

One particular area where it would be desirable to be able to precisely select the bandgap of a semiconductor alloy is where the desired bandgap is extremely narrow. For example, for infrared detectors a material having a very small bandgap is desirable, so that infrared photons can excite carrier pairs, but the bandgap of the material must be non-zero, since a zero-bandgap region would be effectively shorted out.

Alloys of mercury, cadmium and tellurium are well known to be highly useful in fabricating infrared detectors. Since HgTe is a semimetal (having a very small negative band gap), and CdTe has a band gap of about 1.5 eV, compositions having an extremely small and arbitrarily selectable band gap may be specified simply by varying the proportions of an alloy having the composition $Hg_{1-x}Cd_xTe$. Such alloys are here referred to generically as "HgCdTe". For example, the composition $Hg_{.8}Cd_{.2}Te$ is a 10 micron material, that is, a composition having a bandgap approximately equal to the photon energy of infrared light having a wavelength of 10 microns. By reducing the percentage of cadmium, compositions having a smaller band gap, and therefore a longer operating wavelength, may be produced.

Applications for such a semiconductor, having a small and arbitrarily selectable bandgap, are numerous. However, since the band gap varies with the composition, it is necessary for many applications that the composition of the alloy be uniform. In addition, it is of course necessary, for use in photodetectors, to provide materials which are relatively free of physical defects. Unfortunately, the characteristics of the HgCdTe system make preparation of such alloys difficult. In particular, it is highly desirable to provide an infrared detector operating at a wavelength of 12 microns or longer. Although HgCdTe alloys are transparent to wavelengths as long as 30 microns, and thus HgCdTe detectors operating at such wavelengths should in theory be possible, it has heretofore not been practicable to reliably fabricate HgCdTe alloys for operation at wavelengths significantly longer than 10 microns.

Heretofore long wavelength detectors have also been fabricated using doped semiconductors, such as silicon. With such material, the energy states provided by the dopants within the bandgap are used to provide a small transition energy, and therefore a long-wavelength absorption. However, intrinsic long-wavelength detectors are more efficient, and have much more definite frequency characteristics, than such doped materials. The present invention aims at providing an intrinsic long-wavelength detector, which has heretofore not been practicable to provide.

As discussed in U.S. Pat. No. 3,656,944, which is hereby incorporated by reference, a uniform mixture of mercury, cadmium and tellurium is usually achieved by preparing them as a homogenous liquid mixture. However, if such a mixture is cooled slowly, the solid which freezes out will have a progressively varying composition. To avoid these differential freezing effects, one method which has been attempted in the art is to quench a homogenous liquid mixture. However, two further difficulties arise in such a quenching process. First, as with most quenching processes where the solid state is significantly denser than the liquid state, the contraction of the liquid mixture as it solidifies is likely to cause formation of voids and "pipes" (that is, longitudinal voids near the center of a cylindrical body). Second, due to the very high vapor pressure of mercury at all temperatures of interest, it is difficult to prevent mercury from escaping from the solid-liquid mixture into any adjacent vacant space, including voids which may be created during the freezing of the mixture. U.S. Pat. No. 3,656,944 discusses ways to minimize this escape of mercury, but the method disclosed by this patent still permits significant inhomogeneity to remain in the alloy produced, and the imprecision of this method also does not permit full exploitation of the advantages which may be obtained, as discussed above, from selecting the band gap of the material produced by controlling the exact composition of the alloy used. Other methods of making HgCdTe have also not succeeded in attaining good yield rates.

Vapor phase epitaxy of HgCdTe has also been attempted, but this approach may result in a graded composition, and is believed not to provide the advantages of the present invention. See Becla, "A Modified Approach to Isothermal Growth of Ultrahigh Quality HgCdTe for Infrared Applications", forthcoming in *J. Electrochemical Soc.*

A further problem with present methods of HgCdTe production is that the area of the photodetector which can be produced is limited by the maximum single-crystal size which can be provided. Since the largest single-crystal size which is currently practical in production quantities is on the order of one inch square, this places a drastic size limitation on present HgCdTe detectors.

General references on the properties of CdTe and HgTe, and of certain other analogous ternary and quaternary systems, may be found in K. Zanio, 13 *Semiconductors and Semimetals* (1978), especially at pages 212 and following; and Harman, "Properties of Mercury Chalcogenides", in *Physics and Chemistry of II-VI Compounds* (ed. M. Aven & J. Prener, 1967); all of which are hereby incorporated by reference.

In addition, discussion of the properties and utilities of a wide variety of semiconductor alloys and compounds may be found in the following publications which are hereby incorporated by reference:

"Ternary Compounds, 1977", edited by G. D. Holah, Conference Series Number 35, The Institute of Physics, Bristol and London.

M. Gernard, "Glances at Ternary Compounds", *Journal de Physique*, 36, C3-1 (1975).

R. Nitsche, "Crystal Chemistry, Growth and Properties of Multi-Cation Chalcogenides", *Journal de Physic*, 36, C3-9 (1975).

R. C. Smith, "Device Applications of the Ternary Semiconducting Compounds", *Journal de Physic*, 36, C3-89 (1975).

It is also frequently desirable to be able to detect the spectrum of a distant object. One method for doing this is to image the same object on different detectors, each operating at different wavelengths. However, such a system requires precise optical calibration and adjustment, and, to resist decollimation, such a system must be made relatively bulky and heavy. Thus, it would be highly desirable to provide an infrared detector which could directly detect more than one wavelength on a single substrate.

It is an object of the present invention to provide compound semiconductor devices suitable for use as photodetectors. It is a further object of the present invention to provide HgCdTe films suitable for use as photodetectors.

It is a further object of the present invention to provide compound semiconductor devices, suitable for use as photodetectors, which have a very low density of material defects.

It is a further object of the present invention to provide compound semiconductor films, suitable for use as photodetectors, which have extremely homogenous composition.

It is a further object of the present invention to provide a method for producing compound semiconductor films wherein the exact composition of the final alloy may be accurately preselected.

It is a further object of the present invention to provide compound semiconductor devices, suitable for use as photodetectors, which have extremely flat surfaces.

It is a further object of the present invention to provide compound semiconductor films, suitable for use as photodetectors, which have a very large area. It is a particular object of the present invention to provide monolithic compound semiconductor films, suitable for use as photodetectors, which have an area significantly larger than one square inch.

It is a further object of the present invention to provide compound semiconductor films, suitable for use as photodetectors, which have an extremely low density of surface defects.

It is a further object of the present invention to provide a process for manufacturing compound semiconductor devices which provides an extremely high yield of satisfactory devices (i.e., number of satisfactory devices as a percentage of total devices).

It is a further object of the present invention to provide a method for manufacturing compound semiconductor devices, in which the yield rate is relatively insensitive to variation in parameters in the manufacturing process.

It is a further object of the present invention to provide a process for manufacturing compound semiconductor devices which does not require precise control of all manufacturing process parameters.

It is a further object of the present invention to provide a process for manufacturing compound semiconductor devices which includes self-limiting steps, so that the manufacturing process achieves no further effect on the device being manufactured, once the desired end product stage has been achieved.

It is a further object of the present invention to provide compound semiconductor devices for detection of very long wavelength light.

It is a further object of the present invention to provide compound semiconductor devices for detection of light at wavelengths longer than 12 microns.

It is a further object of the present invention to provide compound semiconductor structures having a uniform and extremely small non-zero band gap.

It is a further object of the present invention to provide a method for producing uniform films of an intrinsic semiconductor having an extremely small non-zero band gap.

It is a further object of the present invention to provide a method for producing monolithic compound semiconductor films wherein first portions have a band gap corresponding to a first wavelength and second portions have a band gap corresponding to a second wavelength.

It is a further object of the present invention to provide a monolithic compound semiconductor film for multi-color imaging.

SUMMARY OF THE INVENTION

The present invention applies to any system where a semiconductor alloy is formed between two semiconductor materials which have different bandgaps. Preferably the two starting materials should have a good lattice match, i.e. the same crystal structure and approximately the same lattice constants. It is also necessary that the wider-gap material be transparent at a wavelength corresponding to the desired bandgap of the end product. These constraints are satisfied by many different semiconductor systems, such as HgCdTe (which will be discussed in particular detail as an example). AlGaAs, AlGaP, etc.

The wider-gap material is first formed as a substrate, and the narrower-gap material is then applied as an epitaxial layer atop the substrate. Pulsed illumination is then applied through the bottom of the substrate, at a wavelength which approximately corresponds to the desired final bandgap. Each pulse causes localized heating where it first encounters material having a sufficiently narrow bandgap to be an absorber. The localized heating causes interdiffusion, so that a layer of semiconductor alloy is produced in the region of localized heating. Repetition of this step has the effect of moving the region of localized absorption away from the original location, and toward the epitaxial layer/air interface. Since the desired end product composition will be transparent to the illumination applied, the process is inherently self-limiting. By appropriately selecting the wavelength of illumination applied, variously proportioned semiconductor compositions may be obtained, so that the bandgap of the resulting material may be arbitrarily selected to have any desired value between the bandgaps of the two starting materials. Thus, in accordance with the illumination applied, different semiconductor alloys may be produced using the exact same starting structure.

The primary materials to which the present invention is expected to be applied are II-VI alloys (such as HgCdTe) or to III-V alloys (such as AlGaAs) but the process of the present invention is also applicable to a great many other systems of semiconductor alloys, as will be discussed below.

In addition, the surface layer formed can have an extremely homogenous composition, if the following further condition applies: if the diffusion coefficient of the wider-gap material into the narrower-gap material is higher than the diffusion coefficient of the narrower-gap material into the wider-gap material, the composition of the alloy material which is progressively formed within the epitaxial layer will be very nearly uniform. For certain applications, this is highly desirable, and this material condition is satisfied by certain alloy systems of interest, such as HgCdTe. However, where this material condition is not satisfied, application of the present invention still permits formation of a surface layer having a selected bandgap.

According to the present invention, there is provided a process for forming a compound semiconductor alloy having a desired bandgap, comprising the steps of: providing a semiconductor substrate, said substrate comprising a first material which has a bandgap wider than said desired bandgap and which is transparent to light at a wavelength equivalent to said desired bandgap; depositing, on said substrate, a layer of a second material, said second material not being metallic and comprising a bandgap which is smaller than the desired bandgap; illuminating said substrate, from the surface of said substrate on which said layer of said second material was not deposited, with light having a wavelength longer than that corresponding to the desired bandgap.

The present invention achieves the above objects and others, by means of a process in which (e.g.) a HgTe layer is deposited by known methods on a CdTe substrate. The substrate is then illuminated by long-wavelength infrared radiation from behind. Since CdTe is transparent in the infrared, the IR radiation will reach the HgTe/CdTe interface. HgTe is an absorber in the infrared, so that most of the infrared radiation will be absorbed near the HgTe/CdTe interface, which will cause intense local heating at the interface. This intense localized heating will enhance the interdiffusion of the HgTe and CdTe. Since the diffusion rate of Cd in HgTe at the temperatures of interest is higher than that of mercury in CdTe, the interface will in effect be moved away from the original location and toward the film/air interface. Since a HgCdTe composition which has a larger band gap than the energy of the IR illumination will be transparent to the wavelength of the IR illumination, the region of localized heating will gradually move, as the interdiffusion progresses, toward the film/air interface. Thus, a trail of HgCdTe with band gap slightly larger than that corresponding to the wavelength used will be left behind, while the region where the IR illumination is absorbed will move closer and closer to the film/air interface. When a HgCdTe composition having a sufficiently large band gap to be transparent to the IR illumination used reaches the surface, the process will automatically stop, since the whole device is now transparent to the IR illumination used. Thermal relaxation will cause a slight additional interdiffusion to occur, so that the longest absorption wavelength of the HgCdTe composition at the surface of the device, once the process is finished, will be somewhat shorter than the wavelength of the IR illumination used. Since the wavelength of the IR illumination used controls the band gap of the final composition achieved, the preferred embodiment uses an IR laser to provide the long-wavelength source of IR illumination. However, it is believed that a broader-spectrum IR light source could also be used successfully.

Thus, in addition to the objects of the invention summarized above, the preferred embodiments of the present invention provide at least the following crucial advantages: (1) the process is self-limiting, in the sense that, once a semiconductor composition corresponding to the desired band gap has been achieved, further application of the process will not affect the system. This is a substantial asset in a manufacturing environment. (2) By varying the wavelength of illumination, it is possible to obtain different band gap semiconductor compositions using the same starting material. In other words, various compositions, each tailored to a specific application, can be provided using essentially the same manufacturing process. (3) Since the illumination is provided through the substrate, no surface damage occurs.

According to a further embodiment of the present invention, the process for manufacturing a semiconductor alloy having a composition corresponding to a desired band gap further comprises the additional step of: illuminating said substrate again, at a second wavelength which is shorter than the wavelength of the first illumination but is not shorter than the wavelength corresponding to the band gap of the desired alloy which is to be attained, the second illuminating step being performed after the first illuminating step.

A further advantage of the present invention is that the localized heating produced causes desirable annealing effects, particularly near the surface of the device, such as reduction of small-angle grain boundaries. Thus, carrier trapping is reduced and conductivity is improved.

It is also possible to apply successive steps of illumination at successively shorter wavelengths, with progressively increased masking being applied. Such a process permits formation of structures which have different bandgaps in different areas of the surface layer.

Such structures may be useful not only for multi-color photodetector arrays, but also for, e.g., avalanch photo diodes, cooled high speed semiconductor logic elements, non-linear monolithic circuit elements, etc., as well as for applications which may as yet be unforeseen.

According to a further embodiment of the present invention, in a process for manufacturing a semiconductor alloy having a composition corresponding to a desired bandgap, the second step of illuminating is applied only to selected portions of said substrate.

BRIEF DESCRIPTION OF THE DRAWINGS

The present invention will now be described with reference to the accompanying drawings wherein:

FIGS. 7a-7e are graphs showing IR light intensity, localized temperature, interdiffusion coefficient, concentration of cadmium, and band gap, respectively, when a first pulse of infrared illumination is applied to a structure as shown in FIG. 2; and FIGS. 8a-8e are graphs respectively showing IR light intensity, localized temperature, interdiffusion coefficients, concentration of cadmium, and band gap, at the time of the second and of the final pulses applied to the device of FIG. 2, in applying the present invention.

DESCRIPTION OF THE PREFERRED EMBODIMENTS

The present invention will now be explained in detail with reference to one particular alloy system. For convenience, the HgCdTe system, which has utility in infrared detectors, is discussed.

Figure 1:
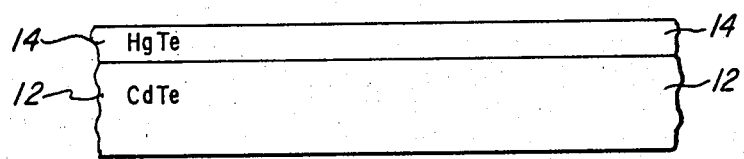
FIG. 1 shows a section of a CdTe substrate, on which a HgTe epitaxial layer has been deposited.

To prepare a HgCdTe device according to the present invention, a CdTe substrate is first provided. The CdTe substrate may be prepared according to a conventional process such as, for example, Bridgman growth. A film of HgTe is then deposited on the CdTe substrate, by a conventional process such as vapor phase epitaxy. Growth of HgTe on a CdTe substrate is shown by publications such as, for example, Kuech & McCaldin, "Low-Temperature CVD Growth of Epitaxial HgTe on CdTe", submitted to *J. Electrochemical Soc.;* and Cohen-Solal et al, "Croissance Epitaxique de Composes Semiconducteurs par Evaporation-Diffusion en Regime Isotherme", 1 *Revue de Physique Appliquee* 11 (1966); both of which are hereby incorporated by reference. Thus, a structure such as that shown in FIG. 1 is achieved. The thickness of the substrate 12 may be, for example, 500 to 800 microns, and the thickness of the epitaxial layer 14 may be, for example, 10 to 30 microns. The thickness of the substrate 12 is not critical. The constraints on the thickness of the epitaxial layer 14 are determined by the desired thickness of the final HgCdTe layer being produced. To achieve good efficiency, the active layer of the device finally achieved (that is, the thickness of the layer of HgCdTe alloy which has the desired composition for infrared detection) should, at its thinnest, be at least one wavelength thick, at the maximum detectable wavelength. Thus, if the desired device is to be a detector operating at 10 microns, the active layer of the desired HgCdTe composition in the operating device should preferably be at least 10 microns thick, and thus the HgTe epitaxial layer which is originally deposited should be at least 8 microns thick. Because the lattice constants of all HgCdTe compositions are approximately equal, the thickness of the HgCdTe layer finally produced may be easily calculated in proportion to the initial layer of HgTe initially deposited. Thus, if a 20 micron layer of HgTe is initially deposited, and the illuminating wavelength is chosen to produce $Hg_{.8}Cd_{.2}Te$ (i.e. approximately 10 micron material) the final thickness will be 20 divided by 0.8, or 25 microns.

For convenience, the HgTe film which is deposited on the CdTe substrate has been referred to frequently in this disclosure as an epitaxial layer. However, a polycrystalline HgTe film, or even a polycrystalline film of a mercury-rich HgCdTe alloy may also alternatively be deposited.

In the presently preferred embodiment of the process of the present invention, a laser is used to provide IR illumination, and the laser light is applied in a series of relatively low-energy pulses. However, it is believed that cw illumination would be equally as effective, except that greater care is required to ensure that large scale melting does not occur.

To more clearly set forth the preferred embodiment, we shall suppose temporarily that it is desired to generate a detector which will operate at 10 microns. Thus, a 10.6 micron $CO_2$ laser may be used to provide the infrared illumination.

Figure 2:
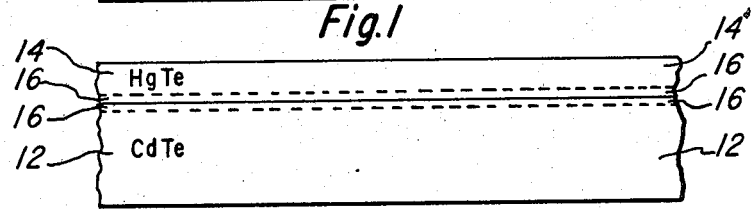
FIG. 2 is a cross sectional view of the structure of FIG. 1 being illuminated by infrared radiation, and indicates the region of localized heating.
Figure 3:
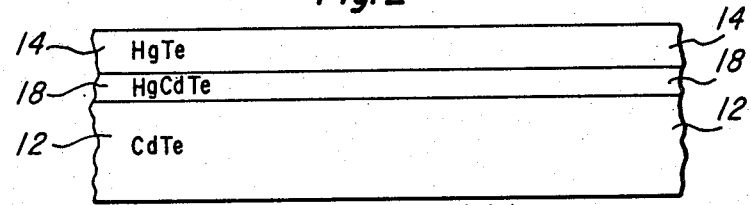
FIG. 3 is a cross sectional view of the device of FIGS. 1 and 2, after the localized heating of the HgTe/CdTe interface has produced a region of HgCdTe alloy.

Since CdTe has a relatively large band gap, it is transparent to light at wavelengths longer than about 0.83 microns. Thus, when infrared illumination is applied to the undersurface of the CdTe substrate, the distribution of light intensity will be as shown in FIG. 7a, where the light is unattenuated in the CdTe, but is rapidly attenuated above the CdTe/HgTe interface. Since most of the light absorption takes place within the HgTe near the interface, the distribution of localized temperature rise caused by the light absorption will be as shown in FIG. 7b. This very strong localized heating (of the region 16 shown in FIG. 2) produces a localized increase in the interdiffusion coefficient, as shown in FIG. 7c. Thus, a concentration of cadmium begins to diffuse into the HgTe layer, as shown in FIG. 7d, and a tapered band gap results, approximately as shown in FIG. 7e. Thus, a large-band-gap HgCdTe alloy 18 now exists at the former location of the HgTe/CdTe interface, as shown in FIG. 3.

Thus, when a second laser pulse is applied, the pulse is unattenuated through the CdTe, and also through the region 18 of large-band-gap alloy which has now been created. When the second pulse encounters low-band-gap HgCdTe alloy and HgTe, this pulse too is rapidly attenuated, as shown by the light intensity plot of FIG. 8a. Thus, localized heating is again produced, as shown in FIG. 8b. However, note that the location of the localized heating has now been shifted toward the film/air interface. Diffusion coefficients are thus increased, as shown in FIG. 8c, and a further diffusion of cadmium into the former HgTe layer is caused, as shown in FIG.

Figure 4:
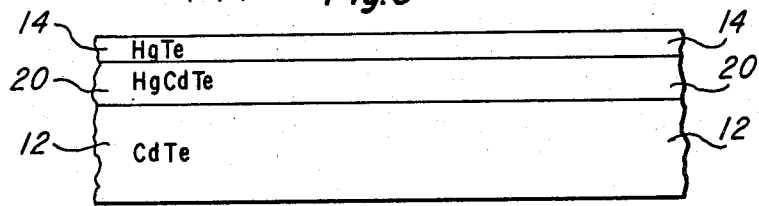
FIG. 4 is a cross sectional view of the device of FIG. 3, after further infrared illumination.

8d. A larger layer 20 of HgCdTe alloy has now been produced as shown in FIG. 4. The resulting profile of band gap versus depth is approximately as shown in FIG. 8e, where it may be seen that successive laser pulses, by causing localized increases of diffusion, have caused a region of marginally transparent alloy (that is, HgCdTe alloy having a band gap just larger than the photon energy of the IR illumination applied) to progressively extend upward through the former HgTe layer.

Figure 5:
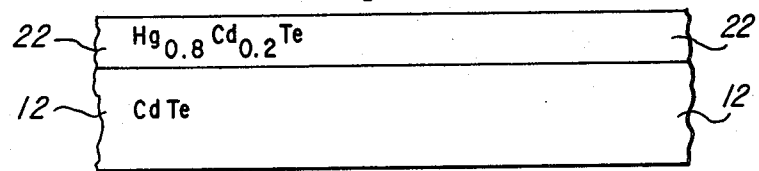
FIG. 5 shows a section of a finished device produced by the method of the present invention, with particular values of HgCdTe composition, corresponding to a particular wavelength of IR illumination, indicated.

Repeated application of laser pulses continues to cause this effect, until the last effective pulse causes parameter distribution as shown by the dotted curves in FIG. 8. After the last effective pulse, a small concentration of cadmium has been caused to diffuse throughout the former HgTe layer, and the band gap throughout the HgCdTe layer 22 (shown in FIG. 5) is now just barely above the photon energy of the IR illumination, as shown by the dotted curve in FIG. 8e.

The present process is self-limiting, as discussed above. However, while close monitoring of process completion is not required for reliable production, it is convenient for manufacturing control to know when the process has gone to completion, so that time is not wasted in further illumination of completed devices. Since the device becomes transparent to the IR illumination wavelength used when processing is completed, a simple luminance detector (e.g. a crude thermal detector,) may be used to detect completion of the illumination step of the process.

No doping is required in such a narrow-band-gap intrinsic material. However, it might be desirable to select a conductivity type, by means of doping or thermal processing, with regard to the type of carriers which would be generated by incident light, e.g. where a HgCdTe detector was to be embodied in a monolithic device including other electrical circuits.

At this point a minimally functional structure has been achieved, but additional processing steps will further improve the device characteristics. First, it should be noted that the dotted curves in FIGS. 8d and 8e are not quite constant within the former HgTe layer. However, the material at the surface has the narrowest band gap, and the rate of change of band gap with depth is small near the surface. In many applications such as IR imagers based on charge transfer devices, this slight gradation within the active layer will be unimportant.

Where a non-uniformity of band gap with depth is undesirable, there are at least two ways to avoid it: the simplest way is to use a two-step process. A process as described above is first applied, using an illumination wavelength which is much longer than that corresponding to the desired band gap. Thus, for example, if it were desired to produce a device operating at 4.5 microns, a 10.6 micron laser source might be used in a first step of illumination, as described above. A 5 micron source might then be used to cause a second step of interdiffusion. Since a smaller total redistribution of cadmium would be caused by this second step, a more uniform band gap within the active layer should result.

A further advantage of this two step process is that very economical sources of high power IR illumination (such as $CO_2$ or other cheap IR lasers) could be used for the first step, at one of a relatively small number of wavelengths selected in accordance with the final band gap desired, and a more expensive second source of illumination, at a more selectively determined frequency, could then be used to provide the final step of precise tailoring to the band gap desired.

Figure 6:
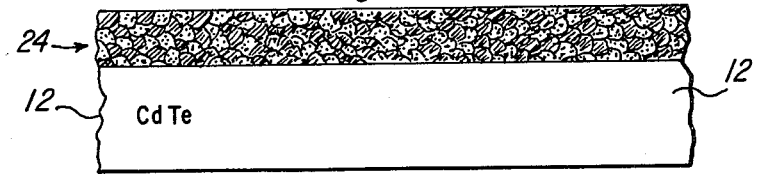
FIG. 6 is a cross sectional view of a device, to which the present invention is to be applied, comprising a sputtered film including HgTe and CdTe globules on top of a CdTe substrate.

A further answer to non-uniformity of the band gap is to initially provide some CdTe deposited on top of the HgTe layer, so that the CdTe constituent of the final active layer is not rquired to diffuse entirely through the HgTe layer. Thus, after the HgTe film has been deposited on top of the CdTe substrate layer, CdTe or a composite of CdTe globules and HgTe globules would be deposited atop the HgTe layer by sputtering. The laser illumination steps according to the present invention would then be applied to a structure such as that shown in FIG. 6.

A further embodiment of the present invention could be used to perform additional processing on HgCdTe alloys which have already been crudely prepared by known methods, such as liquid phase epitaxy. Thus, a thin layer of CdTe would be deposited on top of the conventionally-grown HgCdTe slice, and infrared illumination applied, as discussed above, through the CdTe layer, causing interdiffusion which would increase the band gap of the HgCdTe alloy to a uniform level.

One difficulty caused by the different interdiffusion rates of cadmium and mercury, in applying the process of the present invention, is that vacancy-rich regions are likely to be produced below the original HgTe/CdTe interface, and interstitial inclusions are likely to be produced above the HgTe/CdTe interface. Such defects can produce non-intrinsic regions, and may have undesirable effects on carrier mobility and lifetime. However, such defects can be greatly reduced simply by annealing the device after the interdiffusion process has gone to completion.

The above description of the presently preferred embodiment is based on the use of many low-energy laser pulses. For example, where a 20 micron HgTe film has been deposited on a 760 micron CdTe substrate, a pulse energy of less than 1 Joule per square centimeter can be applied, to a structure which was no hotter than 25° C., without raising the temperature above 575° C. outside the 3 micron thick absorption region. Since a pulse power of one to three Joules per square centimeter is within the range commonly used for laser annealing operations, a pulse power level of one Joule per square centimeter is quite compatible with existing equipment. However, to maximize production in a manufacturing environment, higher-energy laser pulses may be used, if careful attention is paid to thermal effects. Since the phase diagram of the HgCdTe is such that solidification is incongruent (that is, differential freezing takes place, as discussed above), it is prudent to avoid large scale melting. While localized melting may occur over a thickness of a few microns, such localized melting will be so quickly resolidified that the differential freezing effects are of slight importance and such localized melting can perturb the composition of the alloy only over a small region. In addition, the deleterious effects of mercury distillation, as discussed above, must also be avoided. Thus large scale melting places one important constraint on acceleration of the process according to the present invention. However, there is no corresponding lower limit on the speed with which the process of the present invention must be completed (that is, on the power of the pulses used). The existing published study on the interdiffusion of mercury and cadmium refers to a temperature of around 550° C. (see L. Svob et al, "Influence of the Mercury Vapor Pressure on the Isothermal Growth of HgTe over CdTe", 46 J. Appl. Phys, 4251 (1975), which is hereby incorporated by reference), but there is no reason to believe that the same differential interdiffusion effect would not also obtain at lower temperatures. Thus, by keeping the pulse energy relatively low (e.g. less than 1 Joule per square centimeter, as discussed above), and by allowing time for thermal relaxation and cooling between pulses, the undesirable effects of large scale melting are reliably avoided.

The melting point of HgTe is in the neighborhood of 670° C., the melting point of CdTe is in the neighborhood of 1090° C., and the melting point of the various HgCdTe compositions varies smoothly between the two temperatures. Thus, when differential solidification takes place, the higher-melting-temperature alloys, which will tend to freeze out first, are in this system the cadmium-rich alloys. This effect can also be applied advantageously in the present invention, since, if cooling is applied primarily to the upper surface of the HgTe layer, the cadmium-rich alloys, which will tend to freeze out first, will be preferentially deposited near the upper surface of the metal zone. Thus migration of cadmium across the melted zone into the former HgTe layer, as desired, will be greatly accelerated. Such accelerated transfer of cadmium might be used, for example, by applying a first high-energy pulse to cause melting over a relatively thick layer (on the order of tens of microns thick), as long as the melted region did not extend to the top surface of the HgTe film. Low-power pulses, as discussed above, could then be successively applied to attain a homogenous HgCdTe composition as discussed above.

To support the structure while it is being illuminated, it is simply positioned over a hole in a carrier. Alternatively, a carrier comprising windows of an infrared-transparent material, such as germanium, can be used. Alternatively, the upper surface of the structure, where the HgTe has been deposited, can be bonded to a carrier, without other support for the substrate. This structure would also provide desirable thermal sinking through the upper surface of the device.

When such cooling through the HgTe layer is desired, or in general to facilitate manipulation of the devices being prepared, the HgTe surface of the device can be bonded to a simple thermal sink, e.g. by applying a thick layer of photoresist to the surface.

While it would also be possible to apply simple cw illumination in practicing the present invention, use of cw illumination would be much more conducive to large scale melting, since thermal relaxation would produce widespread, rather than localized, heating. Where a cw laser is the most convenient power source, the laser may simply be scanned across the device, or even chopped, to produce an effect similar to that of a pulse laser. A minor difficulty in use of a sharply collimated scanning cw laser, however, is that small lateral migration effects may be produced between heated and adjacent nonheated areas, so that the device finally produced is not perfectly laterally uniform as might be desired. However, this effect should be minor. When it is necessary to minimize this effect, it is possible to use a two stage process, as discussed above, where the first step comprises scanning with a high-power cw laser, and the second step comprises uniform pulsed illumination with a shorter-wavelength decollimated source.

The desirably wavelength-selective properties of the process of the present invention may also be employed, by using an additional patterning step, to produce a two-color (or multi-color) photodetector. Thus, the process of the present invention would first be applied to produce a uniform device capable of operating at the longest of the multiple wavelengths which it is desired to detect. Next, irradiation is again applied at the next shorter of the desired wavelengths, but this second step of irradiation is applied only to selected areas of the device. The selected areas may be patterned in accordance with the desired final configuration of the respective elements for detecting various colors. Subsequent irradiation steps may be applied to successively smaller areas of the substrate, at successively shorter wavelengths, until the desired configuration of color detectors is finally produced. Of course, to actually generate a functional multi-color device, appropriate isolation will have to be provided between the pixels operating at different colors; but the present invention is believed to provide the first practical means for generating a film having a desired pattern of areas having different bandgaps.

Although the radiation assisted interdiffusion process has been described in detail for the HgTe/CdTe system, it may be applied in general to other systems of the type $A^{(1)}B^{(1)}/A^{(2)}B^{(2)}$ provided the following requirements are met:

(1) The band gap of the starting epitaxial film $A^{(1)}B^{(1)}$ is smaller than that of the substrate $A^{(2)}B^{(2)}$.

(2) The wavelength $\lambda$, of the radiation used is such that the film $A^{(1)}B^{(1)}$ is an absorber but the substrate $A^{(2)}B^{(2)}$ is transparent to $\lambda$ (i.e., $1.24/Eg^{(2)} < \lambda < 1.24/Eg^{(1)}$, where $\lambda$ is in microns and Eg is eV).

(3) The band gap, Eg (x,y) of the desired alloy $A^{(1)}_{1-x} A^{(2)}_x B^{(1)}_y B^{(2)}_{1-y}$ is a monotonic function of alloy composition x,y with $Eg^{(1)} \leq Eg(x,y) \leq Eg^{(2)}$.

Preferably the substrate in the epitaxial layer should have the same crystal structure, and should have approximately equal lattice constants. However, this requirement is not inflexible. First, a moderate difference in lattice constants may be tolerated, although a higher density of defects in the epitaxial layer and of anomalous interface conditions may result. Secondly, it is also possible to attain a good match between a substrate and an epitaxial layer which have different crystal structures. However, in such a case it is also necessary that the crystal structure of the desired alloy should be the same as that of the epitaxial layer.

An example of a III-V materials system, used for near IR detectors, that meets these requirements is $In_{1-x} Ga_x As$. In this example $B^{(1)} = B^{(2)}$. The band gaps of the GaAs substrate and the InAs film are 1.52 and 0.43 eV respectively. See T. I. Pankove, "Optical Processes in Semiconductors", Dover, New York, 1971, p. 27, which is hereby incorporated by reference. If radiation with $\lambda = 0.8$ to 2.9 micron propagates through the GaAs substrate, energy will be absorbed in the InAs film resulting in localized heating and enhanced interdiffusion. The diffusion coefficients of various species in GaAs and InAs can be calculated for T=1053K using diffusion data compiled by Kendall. See D. L. Kendall, "Semiconductors and Semimetals", Vol. 4, Academic Press, New York, 1968, Chapter 3, all of which is hereby incorporated by reference. Typical values range from $10^{-13}$ to $10^{-15}$ cm²/sec in GaAs and $10^{-9}$ to $10^{-12}$ cm²/sec in InAs.

Apart from the temperature considered (T=1050K for InAs/GaAs and 823K for HgTe/CdTe) and the absolute magnitudes of the diffusion coefficients, this case closely parallels that of HgTe/CdTe in the sense that interdiffusion in the film occurs more readily than in the substrate. All aspects of the process outlined for HgTe/CdTe also apply in this example.

| Diffusion Coefficients in GaAs and InAs T = 1053K | | |
|---|---|---|
| Species | D(cm$^2$/sec) GaAs | D(cm$^2$/sec) InAs |
| Mg | $1.48 \times 10^{-13}$ | $5.54 \times 10^{-12}$ |
| Zn | $2.28 \times 10^{-11}$ | $8.70 \times 10^{-9}$ |
| Cd | $2.56 \times 10^{-15}$ | $1.19 \times 10^{-9}$ |
| Sn | $5.81 \times 10^{-15}$ | $4.17 \times 10^{-12}$ |
| S | $2.93 \times 10^{-13}$ | $2.45 \times 10^{-10}$ |
| Se | $5.40 \times 10^{-17}$ | $4.55 \times 10^{-10}$ |

Thus, the present invention may be applied to many other families of semiconductor compounds, providing that they satisfy the above conditions. For example, I-III-VI$_2$ or chalcopyrite compounds such as AgGaS$_2$, CuAlS$_2$, LiInSe$_2$, CuFeS$_2$ etc., II-IV-V$_2$ compounds such as ZnSiP$_2$, II-III$_2$-V$_4$ compounds, such as CdIn$_2$S$_4$ IV-VI alloys (such as PbSnTe and PbSnSe), or other semiconductor alloys, may be used as constituents of selected-bandgap alloys formed by the method of the present invention.

Of course, when alloys are formed among semiconductor compounds, deviation from stoichiometry must be avoided. Differential diffusion rates may frequency produce some such deviation, but this is removed by a post-annealing step. In general, the greater the difference in the relevant diffusion coefficients, the greater deviation from stoichiometry is likely to result before the post-annealing step is applied. However, even where the diffusion coefficients are quite significantly different as in HgCdTe, a mild post-anneal suffices.

Alloys among ternary semiconductor compounds, such as the chalcopyrite and other compounds referred to above, may have quite complex compositions. However, since the final bandgap attained by the process of the present invention is limited by the bandgaps of the starting materials, it may be necessary to resort to systems of less commonly used semiconductors in order to obtain a desired range of variation.

For example, the AlGaAs system permits bandgaps between 1.43 eV and 2.16 eV to be attained, corresponding to direct detection of optical wavelengths between approximately 580 nm and approximately 860 nm. However, where a wavelength outside this band was desired, it would be necessary to use another semiconductor alloy system.

It will be obvious to those skilled in the art that further modifications and variations may be introduced, without affecting the scope of the inventive concepts disclosed and claimed by the present invention.

What I claim is:

1. A process for forming a semiconductor alloy having a desired bandgap, comprising the steps of:
providing a semiconductor substrate comprising a first material, said first material having a bandgap wider than said desired bandgap and also being transparent to light at a wavelength corresponding to said desired bandgap;
depositing on said substrate a layer of a second material, said second material not being metallic and comprising a bandgap which is smaller than said desired bandgap; and
illuminating said substrate, from the surface of said substrate on which said layer of said second material was not deposited, with light having a wavelength which is at least as long as that corresponding to said desired bandgap.

2. The process of claim 1, wherein said second material comprises a semimetal.

3. The process of claim 1, further comprising the step of:
illuminating said substrate again, at a second wavelength which is shorter than the wavelength of said first illumination but is not shorter than the wavelength corresponding to said desired bandgap, said second illuminating step being performed after said first illuminating step.

4. The process of claim 3, wherein said second illuminating step is applied only to selected portions of said substrate.

5. The process of claim 3, further comprising a third illuminating step, wherein said third illuminating step is applied after said first and second illuminating steps, and uses light of a wavelength which is shorter than the wavelength of said second illuminating step but is not shorter than the wavelength corresponding to said desired bandgap, said third illuminating step only being applied to selected areas within those portions of said substrate which have previously been illuminated by said second illuminating step.

6. The process of claim 3 or 4, wherein said second illuminating step applies a wavelength which is approximately equal to that corresponding to said desired bandgap.

7. The process of claim 6, wherein said second material comprises a semimetal.

8. The process of claim 6, wherein said first and second materials each consist essentially of a respective III-V compound.

9. The process of claim 8, wherein said first material consists essentially of AlAs, and said second material consists essentially of GaAs.

10. The process of claim 8, wherein said first material consists essentially of GaAs, and said second material consists essentially of InAs.

11. The process of claim 6, wherein said first and second materials each consist essentially of respective II-VI compounds.

12. The process of claim 1, wherein said illuminating step applies light having a wave length which is approximately equal to that corresponding to said desired bandgap.

13. The process of claim 1,
wherein said illuminating step applies a wave length which is approximately equal to that corresponding to said desired band gap,
and wherein said second material comprises a semimetal.

14. The process of claim 12, wherein said first and second materials each consist essentially of a respective III-V compound.

15. The process of claim 14, wherein said first material consists essentially of aluminum arsenide, and said material consists essentially gallium arsenide.

16. The process of claim 14, wherein said first material consists essentially of gallium arsenide, and said second material consists essentially of indium arsenide.

17. The process of claim 12, wherein said first and second materials each consist essentially of respective II-IV compounds.

18. The process of claim 1, further comprising the additional step of:

after said first illuminating step, repeatedly illuminating said substrate from the surface of said substrate on which said layer of said second material was not deposited, with light having a wave length which is at least as long as that corresponding to said desired band gap, said additional illuminating steps being performed repeatedly until said layer of said second material has been mixed with said first material to provide a mixed material having approximately said desired band gap at the exposed surface of said layer of second material.

19. The process of claim 1, 3, 4, or 16, wherein said layer of said second material is much thinner than said substrate.

20. The process of claim 19, wherein said layer of said second material is an epitaxial layer.

* * * * *